United States Patent
Yamaguchi et al.

(10) Patent No.: US 11,980,106 B2
(45) Date of Patent: May 7, 2024

(54) PERSISTENT CURRENT SWITCH AND SUPERCONDUCTING DEVICE

(71) Applicants: Sumitomo Electric Industries, Ltd., Osaka (JP); RIKEN, Wako (JP); Japan Superconductor Technology, Inc., Kobe (JP)

(72) Inventors: Takashi Yamaguchi, Osaka (JP); Kotaro Ohki, Osaka (JP); Tatsuoki Nagaishi, Osaka (JP); Yoshinori Yanagisawa, Wako (JP); Mamoru Hamada, Kobe (JP)

(73) Assignees: Sumitomo Electric Industries, Ltd., Osaka (JP); RIKEN, Wako (JP); Japan Superconductor Technology, Inc., Kobe (JP)

( * ) Notice: Subject to any disclaimer, the term of this patent is extended or adjusted under 35 U.S.C. 154(b) by 240 days.

(21) Appl. No.: 17/760,788

(22) PCT Filed: Aug. 31, 2020

(86) PCT No.: PCT/JP2020/032810
§ 371 (c)(1),
(2) Date: Mar. 16, 2022

(87) PCT Pub. No.: WO2021/054094
PCT Pub. Date: Mar. 25, 2021

(65) Prior Publication Data
US 2022/0344564 A1 Oct. 27, 2022

(30) Foreign Application Priority Data
Sep. 20, 2019 (JP) ................................. 2019-171841

(51) Int. Cl.
*H01B 12/00* (2006.01)
*H01B 12/06* (2006.01)
(Continued)

(52) U.S. Cl.
CPC ............. *H10N 60/30* (2023.02); *H01B 12/06* (2013.01); *H01B 12/14* (2013.01)

(58) Field of Classification Search
CPC ......... H10N 60/30; H01B 12/06; H01B 12/14
See application file for complete search history.

(56) References Cited

U.S. PATENT DOCUMENTS

2005/0153843 A1\* 7/2005 Kubota .................. H10N 60/30
505/100
2009/0314617 A1 12/2009 Lee et al.
(Continued)

FOREIGN PATENT DOCUMENTS

JP 2014-130793 A 7/2014
JP 2015-053314 A 3/2015
(Continued)

OTHER PUBLICATIONS

Philip C. Michael et al., "A REBCO Persistent-Current Switch (PCS): Test Results and Switch Heater Performance," IEEE Transactions on Applied Superconductivity, Jun. 2017, vol. 27, No. 4.

*Primary Examiner* — Pete T Lee
(74) *Attorney, Agent, or Firm* — Faegre Drinker Biddle & Reath LLP (57) ABSTRACT

A persistent current switch includes a superconducting wire including a substrate and a superconducting layer disposed on the substrate, and a heater. The superconducting wire includes a surface including a first portion and a second portion that are disposed apart from each other along a longitudinal direction of the superconducting wire. The first portion and the second portion face each other. The heater is sandwiched between the first portion and the second portion.

7 Claims, 11 Drawing Sheets

(51) Int. Cl.
*H10N 60/30* (2023.01)
*H01B 12/14* (2006.01)

(56) References Cited

U.S. PATENT DOCUMENTS

| | | | | |
|---|---|---|---|---|
| 2011/0218111 A1* | 9/2011 | Ichiki | ..................... | H10N 60/80 |
| | | | | 505/231 |
| 2013/0085071 A1* | 4/2013 | Nakanishi | .............. | H01B 13/00 |
| | | | | 204/192.24 |
| 2015/0228391 A1 | 8/2015 | Kodama et al. | | |

FOREIGN PATENT DOCUMENTS

| | | | |
|---|---|---|---|
| JP | 2015-198015 A | 11/2015 |
| JP | 2018-117042 A | 7/2018 |
| JP | 2019-096849 A | 6/2019 |
| JP | 2019-160817 A | 9/2019 |
| WO | WO-2014/034295 A1 | 3/2014 |

* cited by examiner

PERSISTENT CURRENT SWITCH AND SUPERCONDUCTING DEVICE

TECHNICAL FIELD

The present disclosure relates to a persistent current switch and a superconducting device. The present application claims priority based on Japanese Patent Application No. 2019-171841 filed on Sep. 20, 2019. The entire contents described in the Japanese patent application are incorporated herein by reference.

BACKGROUND ART

PTL 1 (WO 2014/034295) and PTL 2 (Japanese Patent Laying-Open No. 2015-053314) describe a persistent current switch. In the persistent current switches described in PTL 1 and PTL 2, a superconducting wire is heated by a heater. As a result, the superconducting wire in the heated portion is normally conducted (an electric resistance value of the superconducting wire in the heated portion increases).

PTL 3 (Japanese Patent Laying-Open No. 2015-198015) describes a superconducting wire. The superconducting wire described in PTL 3 includes a substrate, an intermediate layer formed on the substrate, and a superconducting layer formed on the substrate with the intermediate layer interposed therebetween (hereinafter, the superconducting wire having such a structure may be referred to as a thin film superconducting wire).

CITATION LIST

Patent Literature

PTL 1: WO 2014/034295
PTL 2: Japanese Patent Laying-Open No. 2015-053314
PTL 3: Japanese Patent Laying-Open No. 2015-198015

SUMMARY OF INVENTION

A persistent current switch according to the present disclosure includes a superconducting wire including a substrate and a superconducting layer disposed on the substrate, and a heater. The superconducting wire includes a surface including a first portion and a second portion that are disposed apart from each other along a longitudinal direction of the superconducting wire. The first portion and the second portion face each other. The heater is sandwiched between the first portion and the second portion.

DETAILED DESCRIPTION

[Problem to be Solved by the Present Disclosure]

The persistent current switches described in PTL 1 and PTL 2 are not the persistent current switch in which the thin film superconducting wire is used. For this reason, how to improve the heating efficiency of the persistent current switch in which the thin film superconducting wire is used as described in PTL 3 is not clear from the above-described conventional technique.

The present disclosure has been made in view of the above-described problems of the prior art. More specifically, an object of the present disclosure is to provide a persistent current switch that is configured using the thin film superconducting wire and has the improved heating efficiency.

[Advantageous Effect of the Present Disclosure]

According to the present disclosure, the heating efficiency of the persistent current switch configured using the thin film superconducting wire can be improved.

[Description of Embodiments]

First, embodiments of the present disclosure will be listed and described.

(1) A persistent current switch according to one embodiment includes a superconducting wire having a substrate and a superconducting layer disposed on the substrate, and a heater. The superconducting wire includes a surface including a first portion and a second portion that are disposed apart from each other along a longitudinal direction of the superconducting wire. The first portion and the second portion face each other. The heater is sandwiched between the first portion and the second portion.

According to the persistent current switch of (1), the heating efficiency of the persistent current switch can be improved.

(2) In the persistent current switch of (1), the superconducting layer may be located closer to the surface than the substrate.

According to the persistent current switch of (2), the heating efficiency of the persistent current switch can be further improved.

(3) The persistent current switch of (1) or (2) may further include a holding member and a filler. The superconducting wire may be held inside the holding member. The filler may be filled between the superconducting wire and the holding member. The holding member may be formed of a first resin material. The filler may be formed of a second resin material different from the first resin material.

According to the persistent current switch of (3), dew condensation can be prevented from being generated on a surface of the superconducting wire when the persistent current switch is returned from a cryogenic temperature to a normal temperature.

(4) In the persistent current switch of (3), a glass transition point of the second resin material may be lower than a glass transition point of the first resin material.

According to the persistent current switch of (4), the filler can be easily filled between the holding member and the superconducting wire.

(5) In the persistent current switch of (3) or (4), the first resin material may be a thermosetting resin material. The second resin material may be a thermoplastic resin material.

According to the persistent current switch of (5), the filler can be easily filled between the holding member and the superconducting wire.

(6) In the persistent current switches of (3) to (5), the second resin material may be paraffin or a foamed resin material.

According to the persistent current switch of (6), the superconducting wire can be insulated, so that the heating efficiency can be further improved.

(7) A superconducting device according to another embodiment includes the persistent current switches of (1) to (6) and a superconducting coil connected to the persistent current switch.

Detailed Embodiments of the Present Disclosure

With reference to the drawings, details of embodiments will be described below. In the drawings, the same or corresponding portion is denoted by the same reference numeral, and the description will not be repeated.

(Configuration of Persistent Current Switch According to First Embodiment)

A configuration of a persistent current switch (hereinafter, referred to as a "persistent current switch 10") according to a first embodiment will be described below.

Figure 1:
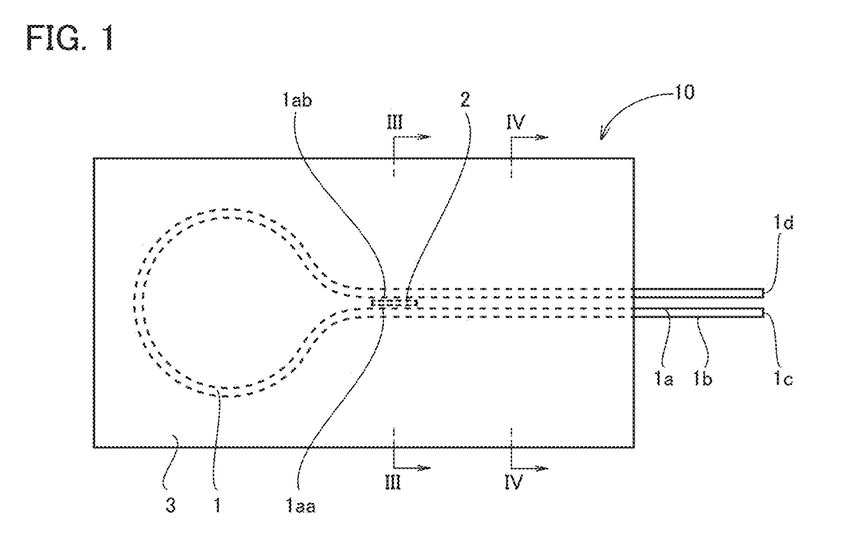
FIG. 1 is a side view illustrating a persistent current switch 10.

FIG. 1 is a side view illustrating persistent current switch 10. As illustrated in FIG. 1, persistent current switch 10 includes a superconducting wire 1 and a heater 2. Persistent current switch 10 may further include a holding member 3 and a filler 4 (not illustrated in FIG. 1, see FIGS. 3 and 4).

Superconducting wire 1 includes a first face 1a and a second face 1b. First face 1a includes a first portion 1aa and a second portion 1ab. First portion 1aa and second portion 1ab are disposed apart from each other in the longitudinal direction of superconducting wire 1. Superconducting wire 1 is bent such that first portion 1aa and second portion 1ab face each other. Superconducting wire 1 includes a first end 1c and a second end 1d. First end 1c and second end 1d are ends of superconducting wire 1 in the longitudinal direction.

Figure 2:
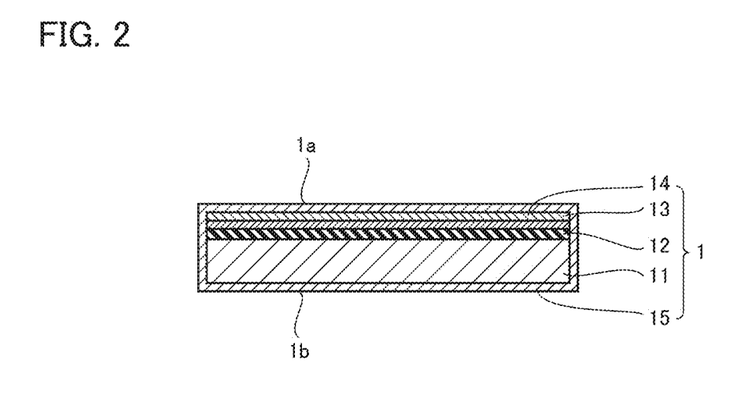
FIG. 2 is a sectional view orthogonal to a longitudinal direction of a superconducting wire 1.

FIG. 2 is a sectional view orthogonal to the longitudinal direction of superconducting wire 1. As illustrated in FIG. 2, superconducting wire 1 includes a substrate 11, an intermediate layer 12, and a superconducting layer 13. That is, superconducting wire 1 is a thin film superconducting wire.

For example, substrate 11 is formed of a clad material in which stainless steel, copper (Cu), and nickel (Ni) are sequentially laminated.

Intermediate layer 12 is disposed on substrate 11. For example, intermediate layer 12 is made of sequentially laminating stabilized zirconia, yttrium oxide, cerium oxide, and the like. For example, intermediate layer 12 is formed by a sputtering method.

Superconducting layer 13 is disposed on substrate 11 with intermediate layer 12 interposed therebetween. Superconducting layer 13 is preferably located closer to first face 1a than substrate 11. Superconducting layer 13 may be located closer to second face 1b than substrate 11.

For example, superconducting layer 13 is made of an oxide superconductor. For example, superconducting layer 13 is formed of $REBaCu_3O_y$ (RE: rare earth element). For example, the rare earth element is yttrium (Y), praseodymium (Pr), neodymium (Nd), samarium (Sm), europium (Eu), gadolinium (Gd), holmium (Ho), or ytterbium (Yb). For example, superconducting layer 13 is formed by a pulse laser deposition (PLD) method.

Superconducting wire 1 further includes a protective layer 14 and a stabilization layer 15. Protective layer 14 is disposed on superconducting layer 13. Stabilization layer 15 is disposed on protective layer 14. Stabilization layer 15 is further disposed on a back surface (a surface opposite to intermediate layer 12) of substrate 11, on the side surface of substrate 11, on the side surface of intermediate layer 12, on the side surface of superconducting layer 13, and on the side surface of protective layer 14. For example, protective layer 14 is formed of silver. For example, stabilization layer 15 is formed of copper. For example, protective layer 14 is formed by a sputtering method, and stabilization layer 15 is formed by an electroplating method.

Figure 3:
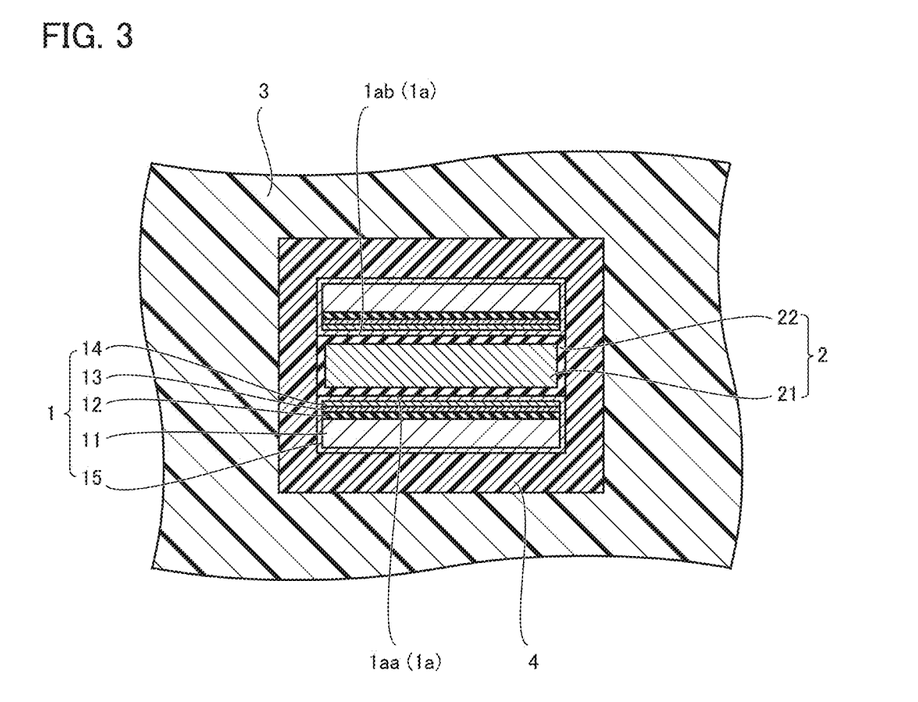
FIG. 3 is a sectional view taken along a line in FIG. 1.

FIG. 3 is a sectional view taken along a line in FIG. 1. As illustrated in FIGS. 1 and 3, heater 2 is sandwiched between first portion 1aa and second portion 1ab. From another point of view, both surfaces of heater 2 are in contact with superconducting wire 1.

Heater 2 includes a heating element 21 and an insulating film 22. Heating element 21 is formed of a material that generates Joule heat by energization. For example, heating element 21 is made of nichrome. Insulating film 22 covers a periphery of heating element 21. This prevents superconducting wire 1 from being short-circuited through heater 2.

As illustrated in FIG. 1, superconducting wire 1 and heater 2 are held inside holding member 3. Holding member 3 is a member that prevents deformation of superconducting wire 1 caused by stress due to electromagnetic force applied to superconducting wire 1. Holding member 3 is made of a resin material. Hereinafter, the resin material constituting holding member 3 is referred to as a first resin material.

Figure 4:
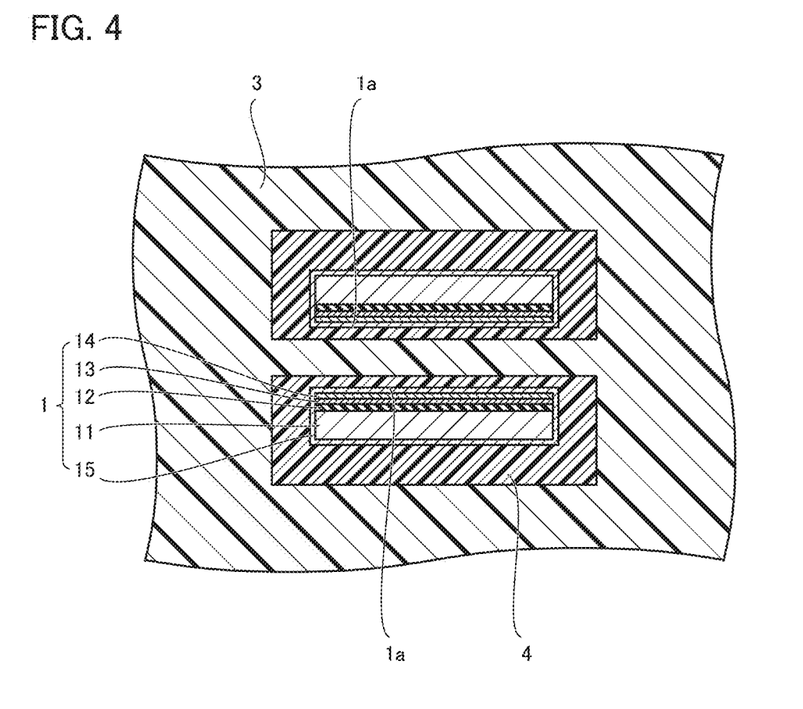
FIG. 4 is a sectional view taken along a line IV-IV in FIG. 1.

FIG. 4 is a sectional view taken along a line IV-IV in FIG. 1. As illustrated in FIGS. 3 and 4, filler 4 is filled between superconducting wire 1 and holding member 3. Filler 4 is formed of a resin material. Hereinafter, the resin material constituting filler 4 is referred to as a second resin material. Second resin material is a resin material different from the first resin material.

Preferably the glass transition point of the second resin material (a melting point of the second resin material when the second resin material is a crystalline resin material. the same applies to the following) is less than the glass transition point of the first resin material (a melting point of the first resin material when the first resin material is a crystalline resin material. the same applies to the following).

The viscosity of the second resin material is preferably lower than the viscosity of the first resin material. The viscosity of the first resin material and the viscosity of the second resin material are measured by a method defined in JIS Z 8803: 2011. When the viscosity of the first resin material and the viscosity of the second resin material are compared at the same temperature and when the latter is lower than the former, "the viscosity of the second resin material is lower than the viscosity of the first resin material".

When the first resin material is a thermosetting resin material, the second resin material may be a thermoplastic resin material. Specific examples of the first resin material are an engineering plastic and a fiber reinforced plastic (FRP). A specific example of the second resin material is paraffin. The second resin material may be a foamed resin material.

Persistent current switch 10 is disposed inside a case (not illustrated) and cooled. Thus, superconducting wire 1 constituting persistent current switch 10 is maintained at a temperature lower than or equal to the superconducting transition temperature. For example, this cooling is performed by liquid nitrogen or liquid helium. First end 1c and second end 1d are drawn from the case and holding member 3.

(Operation of Persistent Current Switch According to First Embodiment)

Operation of persistent current switch 10 will be described below.

Figure 5:
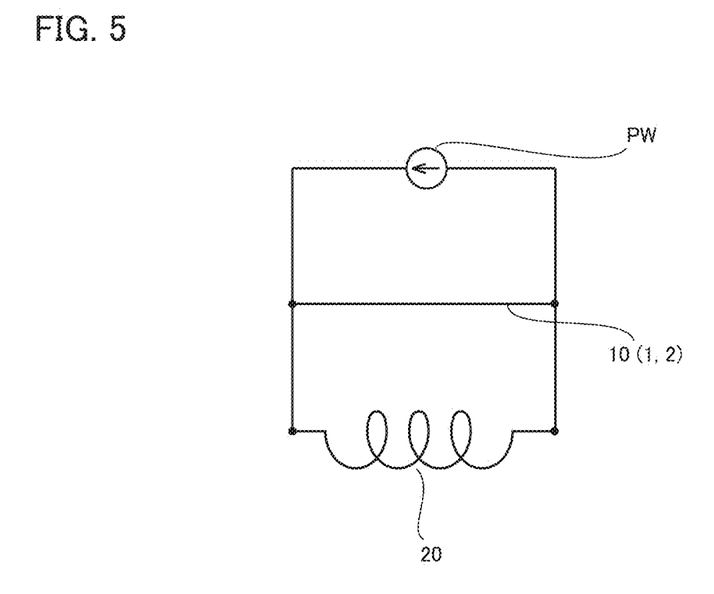
FIG. 5 is a schematic diagram illustrating operation of the persistent current switch 10.

FIG. 5 is a schematic diagram illustrating the operation of persistent current switch 10. As illustrated in FIG. 5, superconducting wire 1 (persistent current switch 10) and a superconducting coil 20 are connected in parallel to a power source PW.

When heater 2 is in an off state (when the current does not flow through heater 2), superconducting coil 20 has coil impedance, so that the current flows exclusively through superconducting layer 13 in superconducting wire 1 that becomes the superconducting state. Accordingly, superconducting coil 20 is not excited (this state is referred to as a first state).

When heater 2 is turned on (when the current flows through heater 2), superconducting layer 13 facing heater 2 becomes the normal conducting state. When the current gradually flows in this state, the current also starts to flow through superconducting coil 20 (this state is referred to as a second state). When a predetermined time elapses after a desired current flows, the current does not flow through superconducting wire 1, but the current flows exclusively through superconducting coil 20 (this state is referred to as a third state).

When heater 2 is turned off again after being in the third state, superconducting layer 13 facing heater 2 returns to the superconducting state. When the current supplied from power source PW is gradually reduced in this state, a part of the current flowing through superconducting coil 20 flows through superconducting wire 1 (this state is referred to as a fourth state).

When the current supplied from power source PW gradually decreases to 0 ampere, the current flows only through superconducting wire 1 and superconducting coil 20 (this state is referred to as a fifth state). When the fifth state is reached, even when power source PW is cut off, the current continues to flow through superconducting wire 1 and superconducting coil 20 (persistent current mode). In this way, persistent current switch 10 can operate superconducting coil 20 in the persistent current mode.

(Method for Manufacturing Persistent Current Switch According to First Embodiment)

A method for manufacturing persistent current switch 10 will be described below.

Figure 6:
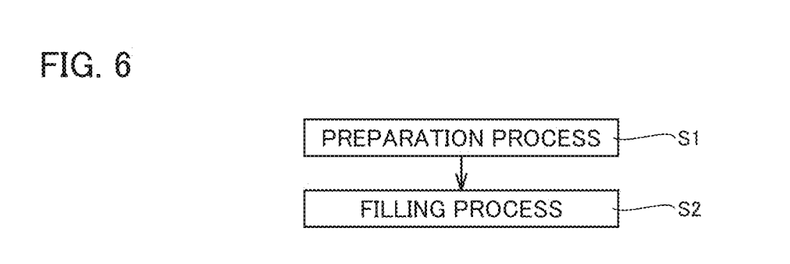
FIG. 6 is a process diagram illustrating a method for manufacturing the persistent current switch 10.

FIG. 6 is a process diagram illustrating the method for manufacturing persistent current switch 10. As illustrated in FIG. 6, the method for manufacturing persistent current switch 10 includes a preparation process S1 and a filling process S2.

Figure 7:
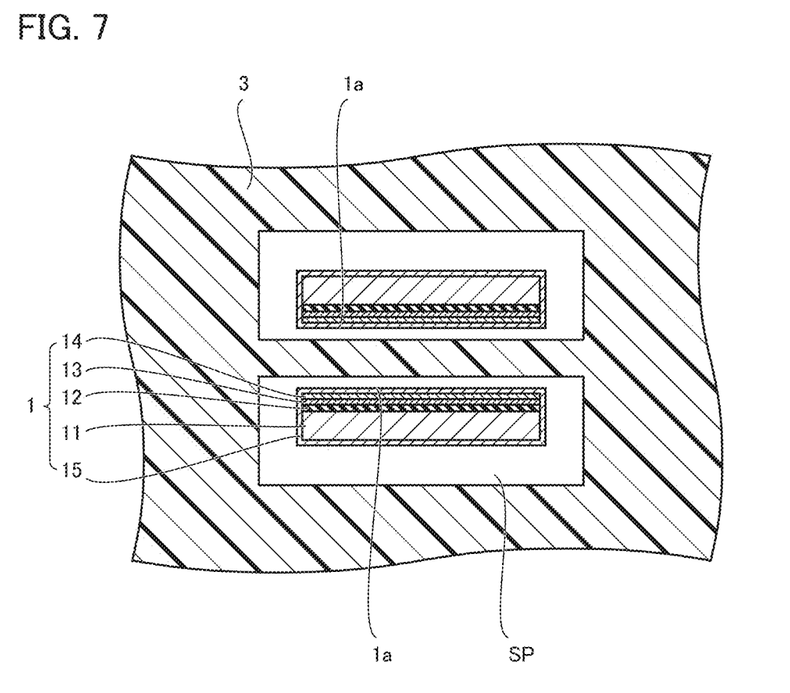
FIG. 7 is a sectional view illustrating the persistent current switch 10 in a preparation process S1.

In preparation process S1, holding member 3 in which superconducting wire 1 is held is prepared. FIG. 7 is a sectional view illustrating persistent current switch 10 in preparation process S1. As illustrated in FIG. 7, in preparation process S1, a void SP remains between holding member 3 and superconducting wire 1.

In filling process S2, filler 4 is filled between superconducting wire 1 and holding member 3 (in void SP). In filling process S2, firstly holding member 3 and filler 4 are heated. The heating temperature at this time is a temperature higher than or equal to the glass transition point of the second resin material and lower than the glass transition point of the first resin material. Filler 4 can easily flow by this heating. In filling process S2, after this heating is performed, filler 4 is poured between holding member 3 and superconducting wire 1.

Filler 4 may be poured between holding member 3 and superconducting wire 1 by immersing holding member 3 in which superconducting wire 1 is held in filler 4 heated to be in the flowing state.

When poured filler 4 is cooled and solidified, a space between holding member 3 and superconducting wire 1 is filled with filler 4. As described above, persistent current switch 10 having the structure illustrated in FIGS. 1 to 4 is formed.

(Effect of Persistent Current Switch According to First Embodiment)

Hereinafter, a basic effect of persistent current switch 10 will be described in comparison with a persistent current switch (hereinafter, referred to as a "persistent current switch 30") according to a first comparative example and a persistent current switch (hereinafter, referred to as a "persistent current switch 40") according to a second comparative example.

Figure 8:
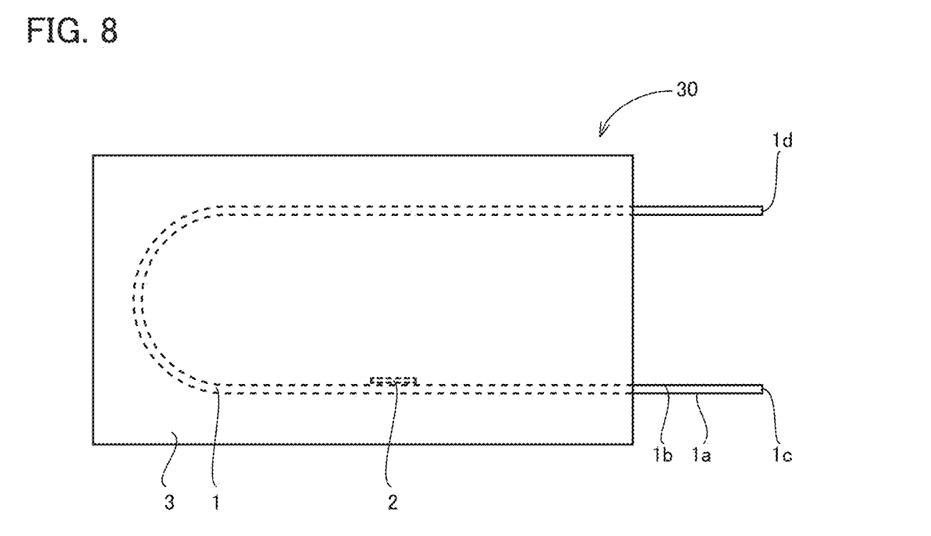
FIG. 8 is a side view illustrating a persistent current switch 30.

FIG. 8 is a side view illustrating persistent current switch 30. As illustrated in FIG. 8, persistent current switch 30 includes superconducting wire 1, heater 2, holding member 3, and filler 4. In this regard, persistent current switch 30 is in common with persistent current switch 10.

However, in persistent current switch 30, only one surface of heater 2 is in contact with superconducting wire 1. Regarding this point, persistent current switch 30 is different from persistent current switch 10.

In persistent current switch 30, only one portion facing heater 2 in superconducting wire 1 is heated. On the other hand, in persistent current switch 10, two portions facing the heater 2 in superconducting wire 1 are heated. As described above, according to persistent current switch 10, a heating length in superconducting wire 1 is increased, and the resistance of superconducting wire 1 is easily increased.

Figure 9:
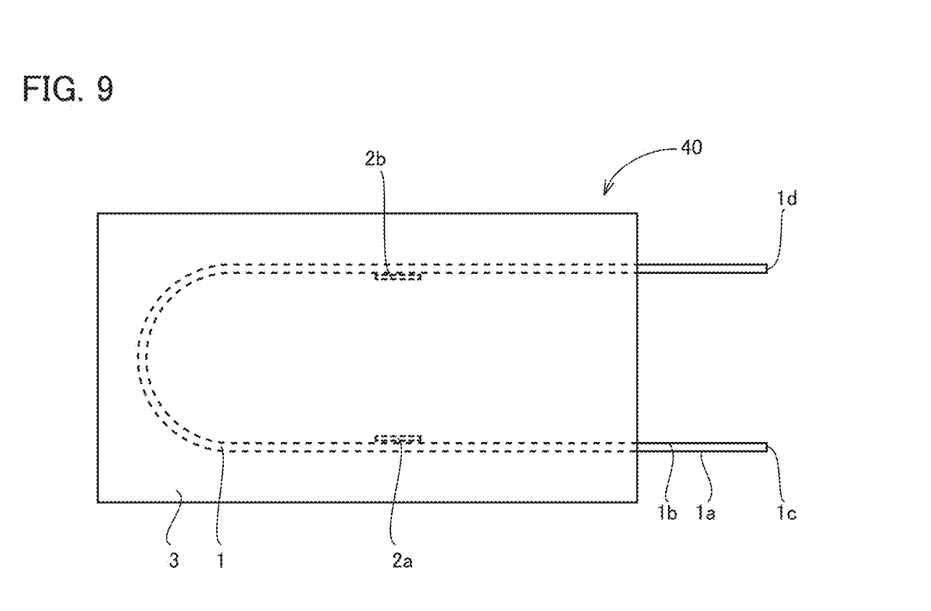
FIG. 9 is a side view illustrating a persistent current switch 40.

FIG. 9 is a side view illustrating persistent current switch 40. As illustrated in FIG. 9, persistent current switch 40 includes superconducting wire 1, heater 2, holding member 3, and filler 4. In this regard, persistent current switch 40 is in common with persistent current switch 10.

However, in persistent current switch 40, the number of heaters 2 is two (these are referred to as a heater 2a and a heater 2b). In persistent current switch 40, only one surface of heater 2 (heater 2a and heater 2b) is in contact with superconducting wire 1. In these respects, persistent current switch 40 is different from persistent current switch 10.

In persistent current switch 40, two portions facing heater 2a and heater 2b in superconducting wire 1 are heated. On the other hand, according to persistent current switch 10, superconducting wire 1 can be heated at two locations by supplying power to one heater 2, so that the power required to operate heater 2 can be reduced as compared with persistent current switch 40.

As described above, according to persistent current switch 10, the heating efficiency by heater 2 can be enhanced. That is, persistent current switch 10 enables the operation in the persistent current mode in a short time and with low power.

Additional effects of persistent current switch 10 will be described below.

In persistent current switch 10, when superconducting layer 13 is located closer to first face 1a than substrate 11, the distance between superconducting layer 13 and heater 2 is shorter than the case where superconducting layer 13 is located closer to second face 1b than substrate 11. Accordingly, in this case, the heat is easily transferred from heater 2 to superconducting layer 13, and the heating efficiency by heater 2 can be further enhanced.

In persistent current switch 10, when superconducting layer 13 is located closer to first face 1a than substrate 11, bending stress generated in superconducting layer 13 in bending superconducting wire 1 is compressive stress. Consequently, in this case, superconducting layer 13 is hardly damaged.

Persistent current switch 10 is returned from the cryogenic temperature to the normal temperature. When there is the gap between holding member 3 and superconducting wire 1, the dew condensation is generated on the surface of superconducting wire 1 when persistent current switch 10 is returned from the cryogenic temperature to the normal temperature. The dew condensation generated on the surface of superconducting wire 1 causes degradation of a superconducting characteristic of the superconducting wire 1.

When filler 4 is filled between holding member 3 and superconducting wire 1, the surface of superconducting wire 1 is covered with filler 4. Accordingly, even when persistent current switch 10 is returned from the cryogenic temperature to the normal temperature, the dew condensation is hardly generated on the surface of superconducting wire 1.

When the glass transition point of the second resin material is lower than the glass transition point of the first resin material, holding member 3 is not softened, but filler 4 is softened to be in a flowable state, so that filler 4 is easily filled between holding member 3 and superconducting wire 1.

Deformation (or dissolution) of holding member 3 can be prevented when the glass transition point of the second resin material is lower than the glass transition point of the first resin material. Furthermore, in this case, when the filling of filler 4 fails, filler 4 can be removed to perform filling process S2 again, so that a yield is improved.

This filling is more easily performed when the viscosity of the second resin material is lower than the viscosity of the first resin material. In this case, the deformation of holding member 3 can be prevented when filler 4 is filled. In particular, because paraffin has a low melting point, it is easy to handle in filling process S2.

When the second resin material is paraffin or a foamed resin material, superconducting wire 1 can be thermally insulated, so that evaporation of the refrigerant can be prevented while the power of heater 2 is reduced.

(Configuration of Persistent Current Switch According to Second Embodiment)

A configuration of a persistent current switch (hereinafter, referred to as a "persistent current switch 50") according to a second embodiment will be described below. In this case, a difference from the configuration of persistent current switch 10 will be mainly described, and redundant description will not be repeated.

Figure 10:
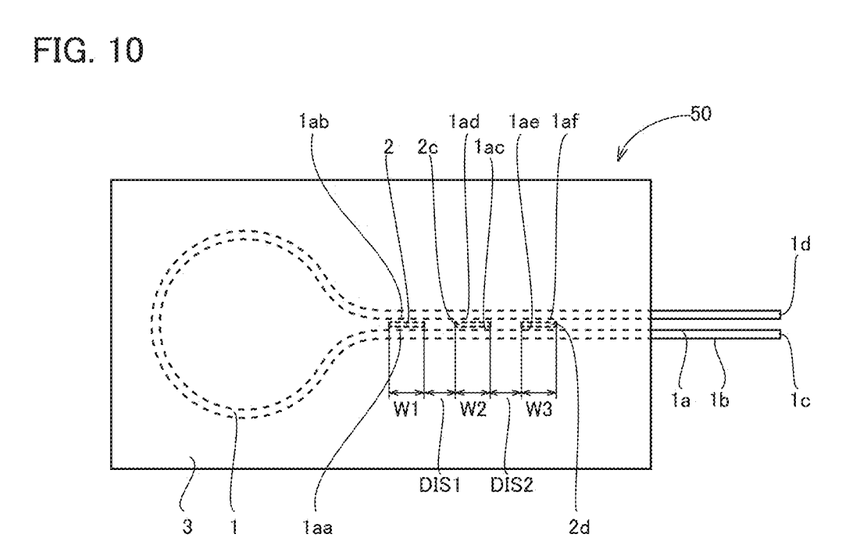
FIG. 10 is a side view illustrating a persistent current switch 50.

FIG. 10 is a side view illustrating persistent current switch 50. As illustrated in FIG. 10, persistent current switch 50 includes superconducting wire 1, heater 2, holding member 3, and filler 4. In this regard, the configuration of persistent current switch 50 is common to the configuration of persistent current switch 10.

Persistent current switch 50 further includes a heater 2c and a heater 2d. In persistent current switch 50, first face 1a further includes a third portion 1ac, a fourth portion 1ad, a fifth portion 1ae, and a sixth portion 1af.

First portion 1aa to sixth portion 1af are disposed apart from each other in the longitudinal direction of superconducting wire 1. Superconducting wire 1 is bent such that first portion 1aa and second portion 1ab face each other, third portion 1ac and fourth portion 1ad face each other, and fifth portion 1ae and sixth portion 1af face each other.

Heater 2c is disposed so as to be sandwiched between third portion 1ac and fourth portion 1ad. Heater 2d is disposed so as to be sandwiched between fifth portion 1ae and sixth portion 1af.

The width of heater 2 in the longitudinal direction of superconducting wire 1 is defined as a width W1, the width of heater 2c in the longitudinal direction of superconducting wire 1 is defined as a width W2, and the width of heater 2d in the longitudinal direction of superconducting wire 1 is defined as a width W2. A distance between heater 2 and heater 2c in the longitudinal direction of superconducting wire 1 is defined as a distance DIS1, and a distance between heater 2c and heater 2d in the longitudinal direction of superconducting wire 1 is defined as a distance DIS2.

Distance DIS1 is preferably less than or equal to an average value of width W1 and width W2. Distance DIS2 is preferably less than or equal to an average value of width W2 and width W3. That is, the distance between the two heaters adjacent to each other in the longitudinal direction of superconducting wire 1 is preferably less than or equal to the average value of the widths of the two heaters adjacent to each other in the longitudinal direction of superconducting wire 1.

Width W1, width W2, and width W3 may be equal to each other or different from each other. Distance DIS1 and distance DIS2 may be equal to each other or different from each other. In the above example, the number of heaters is three, but the number of heaters may be two or at least four.

(Effect of Superconducting Wire According to Second Embodiment)

The effect of persistent current switch 50 will be described below. In this case, a difference from the effect of persistent current switch 10 will be mainly described, and redundant description will not be repeated.

Persistent current switch 50 includes a plurality of heaters (heater 2, heater 2c, and heater 2d) disposed apart from each other along the longitudinal direction of superconducting wire 1, and the heaters are in contact with superconducting wire 1 on both surfaces. Consequently, according to persistent current switch 50, superconducting wire 1 is efficiently heated over a long region, so that the resistance of superconducting wire 1 can be efficiently increased over the long region.

(Examples)

Figure 11:
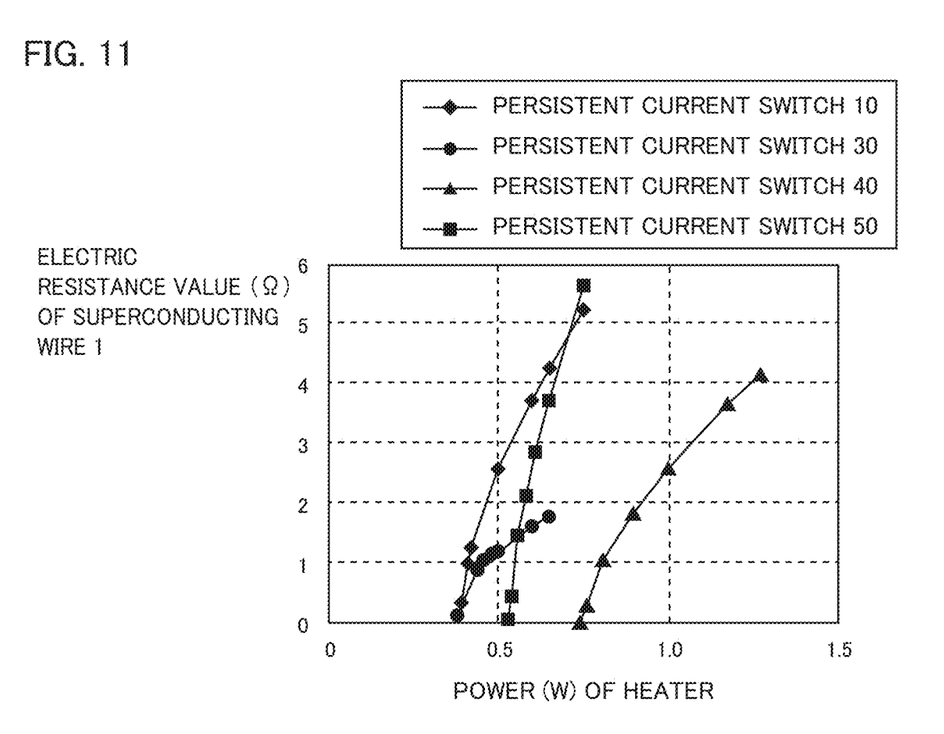
FIG. 11 is a graph illustrating a relationship between power supplied to a heater in each of the persistent current switch 10, the persistent current switch 30, the persistent current switch 40, and the persistent current switch 50 and an electric resistance value of the superconducting wire 1.

FIG. 11 is a graph illustrating a relationship between the power supplied to the heater in each of persistent current switch 10, persistent current switch 30, persistent current switch 40, and persistent current switch 50 and the electric resistance value of superconducting wire 1. In FIG. 11, a horizontal axis represents the power (unit: W) supplied to the heater, and a vertical axis represents the electric resistance value (unit: S2) of superconducting wire 1. In the example of FIG. 11, the heater lengths of persistent current switch 10, persistent current switch 30, and persistent current switch 40 were set to 10 mm. In persistent current switch 50, width W1 to width W3 were set to 3 mm, and distance DIS1 and distance DIS2 were set to 3 mm. Furthermore, with respect to persistent current switch 40 and persistent current switch 50, the power was equally supplied to each heater. The temperatures of persistent current switch 10, persistent current switch 30, persistent current switch 40, and persistent current switch 50 were set to 77 K.

As illustrated in FIG. 11, when the electric resistance value of superconducting wire 1 in persistent current switch 10 and the electric resistance value of superconducting wire 1 in persistent current switch 30 are compared in supplying the same electric power to the heater, the electric resistance value of superconducting wire 1 in persistent current switch 10 became larger. More specifically, in persistent current switch 10, because the length of superconducting wire 1 heated by the heater was twice that of persistent current switch 30, the electric resistance value of superconducting wire 1 was about twice that of persistent current switch 30.

When persistent current switch 10 and persistent current switch 40 were compared with respect to the power of the heater necessary for making superconducting wire 1 had the same electric resistance value, the number of heaters 2 was one in persistent current switch 10, and the number of heaters 2 was two in persistent current switch 40. For this reason, the power applied to heater 2 of persistent current switch 10 became about half of the power applied to the heaters (heater 2a and heater 2b) of persistent current switch 40. As described above, it has been experimentally found that the heating efficiency by the heater can be improved by persistent current switch 10.

Comparing persistent current switch 10 and the persistent current switch 50, when the electric resistance value of superconducting wire 1 was relatively low, the power supplied to the heater of persistent current switch 10 was smaller. However, when the electric resistance value of superconducting wire 1 was relatively high, the power supplied to the heater of persistent current switch 50 became smaller in order to obtain the same electric resistance value. As described above, according to persistent current switch 50, it has been revealed that superconducting wire 1 can be efficiently heated over the long region to efficiently increase the resistance of superconducting wire 1 over the long region.

It should be understood that the first and second embodiments disclosed herein are illustrative in all respects and are not restrictive. The scope of the present invention is defined not by the first and second embodiments but by the claims, and is intended to include meanings equivalent to the claims and all modifications within the scope.

REFERENCE SIGNS LIST

1: superconducting wire, 1a: first face, 1aa: first portion, 1ab: second portion, 1ac: third portion, 1ad: fourth portion, 1ae: fifth portion, 1af: sixth portion, 1b: second surface, 1c: first end, 1d: second end, 2, 2a, 2b, 2c, 2d: heater, 3: holding member, 4: filler, 10: persistent current switch, 11: substrate, 12: intermediate layer, 13: superconducting layer, 14: protective layer, 15: stabilization layer, 21: heating element, 22: insulating film, 20: superconducting coil, 30: persistent current switch, 40: persistent current switch, 50: persistent current switch, PW: power source, S1: preparation process, S2: filling process, SP: void

The invention claimed is:

1. A persistent current switch comprising:
a superconducting wire that includes a substrate and a superconducting layer disposed on the substrate; and
a heater,
wherein the superconducting wire includes a surface including a first portion and a second portion that are disposed apart from each other along a longitudinal direction of the superconducting wire,
the first portion and the second portion face each other, and
the heater is sandwiched between the first portion and the second portion.

2. The persistent current switch according to claim 1, wherein the superconducting layer is located closer to the surface than the substrate.

3. The persistent current switch according to claim 1, further comprising:
a holding member; and
a filler,
wherein the superconducting wire is held inside the holding member,
the filler is filled between the superconducting wire and the holding member,
the holding member is formed of a first resin material, and
the filler is formed of a second resin material different from the first resin material.

4. The persistent current switch according to claim 3, wherein a glass transition point of the second resin material is lower than a glass transition point of the first resin material.

5. The persistent current switch according to claim 3, wherein the first resin material is a thermosetting resin material, and
the second resin material is a thermoplastic resin material.

6. The persistent current switch according to claim 3, wherein the second resin material is paraffin or a foamed resin material.

7. A superconducting device comprising:
the persistent current switch according to claim 1;
a superconducting coil connected to the persistent current switch.

* * * * *